United States Patent
Liu et al.

(10) Patent No.: US 11,367,395 B2
(45) Date of Patent: Jun. 21, 2022

(54) PIXEL DRIVING CIRCUIT AND DRIVING METHOD THEREFOR, DISPLAY PANEL AND DISPLAY APPARATUS

(71) Applicant: BOE TECHNOLOGY GROUP CO., LTD., Beijing (CN)

(72) Inventors: Yingming Liu, Beijing (CN); Haisheng Wang, Beijing (CN); Xiaoliang Ding, Beijing (CN); Lei Wang, Beijing (CN); Pengpeng Wang, Beijing (CN); Changfeng Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 29 days.

(21) Appl. No.: 16/996,248

(22) Filed: Aug. 18, 2020

(65) Prior Publication Data

US 2021/0056905 A1   Feb. 25, 2021

(30) Foreign Application Priority Data

Aug. 19, 2019 (CN) .......................... 201910765155.7

(51) Int. Cl.
*G09G 3/3258* (2016.01)
*H01L 27/32* (2006.01)
(Continued)

(52) U.S. Cl.
CPC ....... *G09G 3/3258* (2013.01); *H01L 27/3234* (2013.01); *H01L 27/3246* (2013.01);
(Continued)

(58) Field of Classification Search
CPC ............. H01L 27/3225; H01L 27/3227; H01L 27/3234; G09G 3/3233; G09G 3/3258;
(Continued)

(56) References Cited

U.S. PATENT DOCUMENTS

2007/0045552 A1\* 3/2007 Masazumi .............. G01T 1/244
250/370.09
2007/0046593 A1\* 3/2007 Shin ..................... G09G 3/3233
345/81

(Continued)

FOREIGN PATENT DOCUMENTS

CN          103325343 A      9/2013
CN          203366702 U     12/2013
(Continued)

OTHER PUBLICATIONS

Office Action dated Jun. 29, 2020 issued in corresponding Chinese Application No. 201910765155.7.

*Primary Examiner* — Yuzhen Shen
(74) *Attorney, Agent, or Firm* — Nath, Goldberg & Meyer; Joshua B. Goldberg (57) ABSTRACT

The present disclosure discloses a pixel driving circuit, a driving method for the pixel driving circuit, a display panel and a display apparatus. The pixel driving circuit for driving a light emitting device includes: a threshold compensation subcircuit, a driving subcircuit and an optical signal detection subcircuit; the threshold compensation subcircuit is coupled to a control electrode of a driving transistor, and a first electrode of the driving transistor is coupled to the light emitting device; the optical signal detection subcircuit is coupled to the threshold compensation subcircuit; and the optical signal detection subcircuit is configured to detect an optical signal which is incident on a region where the optical signal detection subcircuit is located.

19 Claims, 7 Drawing Sheets

(51) Int. Cl.
*H01L 51/52* (2006.01)
*H01L 27/146* (2006.01)
*G06V 40/13* (2022.01)

(52) U.S. Cl.
CPC ........ *H01L 51/524* (2013.01); *H01L 51/5281* (2013.01); *G06V 40/1318* (2022.01); *G09G 2300/0426* (2013.01); *G09G 2330/02* (2013.01); *G09G 2360/14* (2013.01); *H01L 27/1461* (2013.01); *H01L 27/14678* (2013.01)

(58) Field of Classification Search
CPC . G09G 2320/045; G06K 9/0004; G06F 3/042
See application file for complete search history.

(56) References Cited

U.S. PATENT DOCUMENTS

| | | |
|---|---|---|
| 2008/0203930 A1 | 8/2008 | Budzelaar et al. |
| 2016/0163259 A1 | 6/2016 | Kanda et al. |
| 2018/0005007 A1* | 1/2018 | Du .................. G06K 9/2036 |
| 2019/0251378 A1* | 8/2019 | Jung .................. G01S 1/72 |
| 2019/0279566 A1* | 9/2019 | Wang .................. G09G 3/3241 |

FOREIGN PATENT DOCUMENTS

| | | | | |
|---|---|---|---|---|
| CN | 203366705 U | 12/2013 | | |
| CN | 104269142 A | 1/2015 | | |
| CN | 104464625 A | 3/2015 | | |
| CN | 106981268 A | 7/2017 | | |
| CN | 107204172 A * | 9/2017 | ............. | G06K 9/001 |
| CN | 108154844 A | 6/2018 | | |
| CN | 109841189 A | 6/2019 | | |

\* cited by examiner

PIXEL DRIVING CIRCUIT AND DRIVING METHOD THEREFOR, DISPLAY PANEL AND DISPLAY APPARATUS

CROSS REFERENCE TO RELATED APPLICATIONS

The present application claims the priority of the Chinese Patent Application No. 201910765155.7 filed on Aug. 19, 2019, the content of which is incorporated herein by reference in its entirety.

TECHNICAL FIELD

The present disclosure relates to the field of semiconductor display technology, in particular to a pixel driving circuit, a driving method for a pixel driving circuit, a display panel, and a display apparatus.

BACKGROUND

With continuous update and upgrade of an electronic apparatus, the electronic apparatus is provided with an optical signal detection module. For example, the electronic apparatus is provided with a fingerprint recognition module for realizing fingerprint recognition based on detection of an optical signal. Usually, the electronic apparatus is provided with one fingerprint recognition module alone. Under a current trend of generally pursuing simplification of a structure of the electronic apparatus, providing the electronic apparatus with an independent fingerprint recognition module may cause a circuit structure inside the electronic apparatus to be more complicated. Meanwhile, for an electronic apparatus with a display function, the fingerprint recognition module is usually designed below a display screen of the electronic apparatus for convenience of user operation, but the electronic apparatus generally pursues a larger display screen at present, so the design compresses an area of a display region.

SUMMARY

The present disclosure provides a pixel driving circuit, a driving method for a pixel driving circuit, a display panel and a display apparatus.

According to a first aspect of the present disclosure, there is provided a pixel driving circuit for driving a light emitting device to emit light, including: a threshold compensation subcircuit, a reset subcircuit, a driving subcircuit, a light emission control subcircuit, an optical signal detection subcircuit, a storage subcircuit, and a voltage input subcircuit; the threshold compensation subcircuit is electrically coupled to the driving subcircuit, the optical signal detection subcircuit, the storage subcircuit, the reset subcircuit and a second gate line, and is configured to perform threshold compensation on a driving transistor included in the driving subcircuit according to a signal on the second gate line; the reset subcircuit is electrically coupled to the threshold compensation subcircuit, the optical signal detection subcircuit, a reset signal terminal and an initial voltage terminal, and is configured to reset the driving subcircuit under control of a reset signal provided by the reset signal terminal; the driving subcircuit is electrically coupled to the light emission control subcircuit, a driving power supply terminal, the threshold compensation subcircuit and the optical signal detection subcircuit, and is configured to drive the light emitting device to emit light; the light emission control subcircuit is electrically coupled to the driving subcircuit, the light emitting device and a first light emission control terminal, and is configured to control the light emitting device to emit light under control of a first light emission control signal provided by the first light emission control terminal; the storage subcircuit is electrically coupled to the voltage input subcircuit, the driving subcircuit and the threshold compensation circuit, and is configured to store a data voltage and a driving voltage therein; and the voltage input subcircuit is electrically coupled to the storage subcircuit, a second light emission control terminal, the second gate line, the driving power supply terminal, and a data line, and is configured to provide the data voltage and the driving voltage to the storage subcircuit according to a signal on the second gate line and a second light emission control signal, and the optical signal detection subcircuit is electrically coupled between both terminals of the reset subcircuit, and is configured to detect an optical signal which is incident on a region where the optical signal detection subcircuit is located.

In an embodiment, the optical signal detection subcircuit includes a photosensitive device.

In an embodiment, the reset subcircuit includes a first transistor, which has a control electrode coupled to the reset signal terminal, a first electrode coupled to the initial signal terminal, and a second electrode coupled to the driving subcircuit, and a first electrode and a second electrode of the photosensitive device are coupled to the first electrode and the second electrode of the first transistor, respectively.

In an embodiment, the driving subcircuit includes a driving transistor, which has a control electrode coupled to a second electrode of the first transistor, a first electrode coupled to the light emission control subcircuit and a second electrode coupled to the driving power supply terminal.

In an embodiment, the threshold compensation subcircuit includes a second transistor, which has a control electrode coupled to the second gate line, a first electrode coupled to the control electrode of the driving transistor, and a second electrode coupled to the first electrode of the driving transistor.

In an embodiment, the light emission control subcircuit includes: a sixth transistor having a control electrode coupled to a first light emission control terminal, a first electrode coupled to a first electrode of the light emitting device, and a second electrode coupled to the first electrode of the driving transistor; the optical signal detection subcircuit further includes a seventh transistor having a control electrode coupled to a first gate line, a first electrode coupled to the first electrode of the driving transistor, and a second electrode coupled to an output terminal of the optical signal detection subcircuit; and the pixel driving circuit further includes a reference power supply terminal coupled to a second electrode of the light emitting device.

In an embodiment, the storage subcircuit includes a capacitor having a first terminal coupled to the control electrode of the driving transistor, the first electrode of the second transistor and the second electrode of the first transistor, and a second terminal coupled to the voltage input subcircuit.

In an embodiment, the voltage input subcircuit includes: a fourth transistor having a control electrode coupled to the second gate line, a first electrode coupled to the data voltage terminal, and a second electrode coupled to the second terminal of the storage subcircuit; and a fifth transistor having a control electrode coupled to the second light emission control terminal, a first electrode coupled to the second terminal of the capacitor, and a second electrode coupled to the driving power supply terminal.

In an embodiment, the first transistor, the second transistor, the fourth transistor and the fifth transistor are both thin film transistors made of indium gallium zinc oxide.

According to another aspect of the present disclosure, there is also provided a method for driving the above pixel driving circuit, including a display reset stage, a compensation stage and a light emission stage; in the display reset stage, a signal on a reset signal terminal is enabled to be valid, thereby resetting the control electrode of the driving transistor in the pixel driving circuit; in the compensation stage, a signal on the second gate line is enabled to be valid, the data voltage is applied to the second terminal of the capacitor, and the second transistor is turned on, such that a voltage on the first terminal of the capacitor is Vdd−Vth and a voltage on the second terminal of the capacitor is Vdata, where Vdd is a driving voltage on the driving power supply terminal, Vth is a threshold voltage of the driving transistor, and Vdata is the data voltage; and in the light emission stage, a signal on the second light emission control terminal is enabled to be valid, and the fifth transistor is turned on, such that a voltage of the second terminal of the capacitor is Vdd, a voltage of the first terminal of the capacitor is 2Vdd−Vdata−Vth, thereby driving the light emitting device to emit light.

In an embodiment, in the light emission stage, a signal on the first gate line is enabled to be valid, and the seventh transistor is turned on, such that a voltage change due to the photosensitive device being illuminated is output from the output terminal.

In an embodiment, the method further includes, after a period of time has elapsed in the light emission stage, disabling a signal on the first gate line and turning off the seventh transistor, such that the optical signal is no longer detected.

According to another aspect of the present disclosure, there is also provided a display panel, including a substrate; and a plurality of light emitting devices and a plurality of pixel driving circuits for respectively driving the plurality of light emitting devices on the substrate; and at least one of the plurality of pixel driving circuits is the above pixel driving circuit.

In an embodiment, the display panel further includes a polarizer on the substrate; and a glass cover plate on the polarizer, and the light emitting device and the photosensitive device of the at least one of the plurality of the pixel driving circuits are between the substrate and the polarizer.

In an embodiment, the display panel further includes the first transistor and the second transistor on the substrate, wherein the light emitting device and the photosensitive device are on the first transistor and the second transistor, respectively; a first electrode of the light emitting device is electrically coupled to a first drain of the first transistor; a second drain of the second transistor is electrically coupled to a second electrode of the photosensitive device; the first electrode of the light emitting device and a first electrode of the photosensitive device are in a same layer; and a pixel definition layer for the light emitting device is on the first electrode of the photosensitive device.

In an embodiment, the first transistor includes a first active layer, a first gate, a second gate, a first source and a first drain on the substrate in sequence; the second transistor includes a second active layer, a third gate, a second source and a second drain on the substrate in sequence; wherein the first active layer and the second active layer are in a same layer on the substrate; the first gate and the third gate are in a same layer; the first source, the first drain, the second source and the second drain are in a same layer; the display panel further includes a first passivation layer on the first source, the first drain, the second source and the second drain, and a second source/drain layer and a fourth source/drain layer in a same layer on the first passivation layer, wherein the second source/drain layer is electrically coupled to the first drain through a first via hole in the first passivation layer, and the fourth source/drain layer is electrically coupled to the second drain through a second via hole in the first passivation layer; and the display panel further includes a second passivation layer on the second source/drain layer, a planarization layer on the second passivation layer, and a first electrode of the light emitting device on the planarization layer, wherein the first electrode of the light emitting device is coupled to the second source/drain layer through a third via hole in the second passivation layer and the planarization layer; the display panel further includes an N-type amorphous silicon layer, an amorphous silicon layer, a P-type amorphous silicon, an ITO electrode, the second passivation layer and the planarization layer on the second passivation layer on the fourth source/drain layer, wherein the first electrode of the photosensitive device is electrically coupled to the ITO electrode through a via hole in the second passivation layer and the planarization layer.

According to another aspect of the present disclosure, there is also provided a display apparatus including the above display panel.

In an embodiment, the optical signal detection subcircuit includes a photosensitive device, the reset subcircuit includes a first transistor, which has a control electrode coupled to the reset signal terminal, a first electrode coupled to the initial signal terminal, and a second electrode coupled to the driving subcircuit; and a first electrode and a second electrode of the photosensitive device are coupled to the first electrode and the second electrode of the first transistor, respectively.

BRIEF DESCRIPTION OF DRAWINGS

In order to illustrate technical solutions in embodiments of the present disclosure or the related art more clearly, drawings used in a description of embodiments or the related art will be briefly introduced below, it is obvious that the drawings in the description below are only for some embodiments of the present disclosure, and other drawings may be obtained by one of ordinary skill in the art without creative efforts.

DETAIL DESCRIPTION OF EMBODIMENTS

To understand objects, technical solutions and advantages of the present disclosure more clearly, the present disclosure will be described in further detail below with reference to specific embodiments and drawings.

It should be noted that all expressions using "first" and "second" in embodiments of the present disclosure are used for distinguishing between two different entities or different parameters with a same name, and it should be understood that "first" and "second" are only used for convenience of description and should not be construed as a limitation to embodiments of the present disclosure, and no description thereof in following embodiments is provided.

In following embodiments, a driving power supply terminal ELVDD supplies an operating voltage Vdd, a reference power supply terminal ELVSS supplies a reference voltage VSS, a first electrode of a light emitting device L2 is an anode, a second electrode of the light emitting device L2 is a cathode, a first electrode of a photosensitive device L is an anode, and a second electrode of the photosensitive device L1 is a cathode. Normally, the operating voltage Vdd>the reference voltage VSS, which ensures that the light emitting device L2 can emit light normally. In the present embodiment, the reference voltage VSS may be a ground voltage, i.e., the reference voltage VSS is considered to be zero potential. However, the present application is not limited thereto, it can be achieved only in the case where cathode and anode wirings of the light emitting device are also just opposite. In short, it can be achieved only in the case where current flows through the light emitting device and the light emitting device can emit light.

Figure 1A:
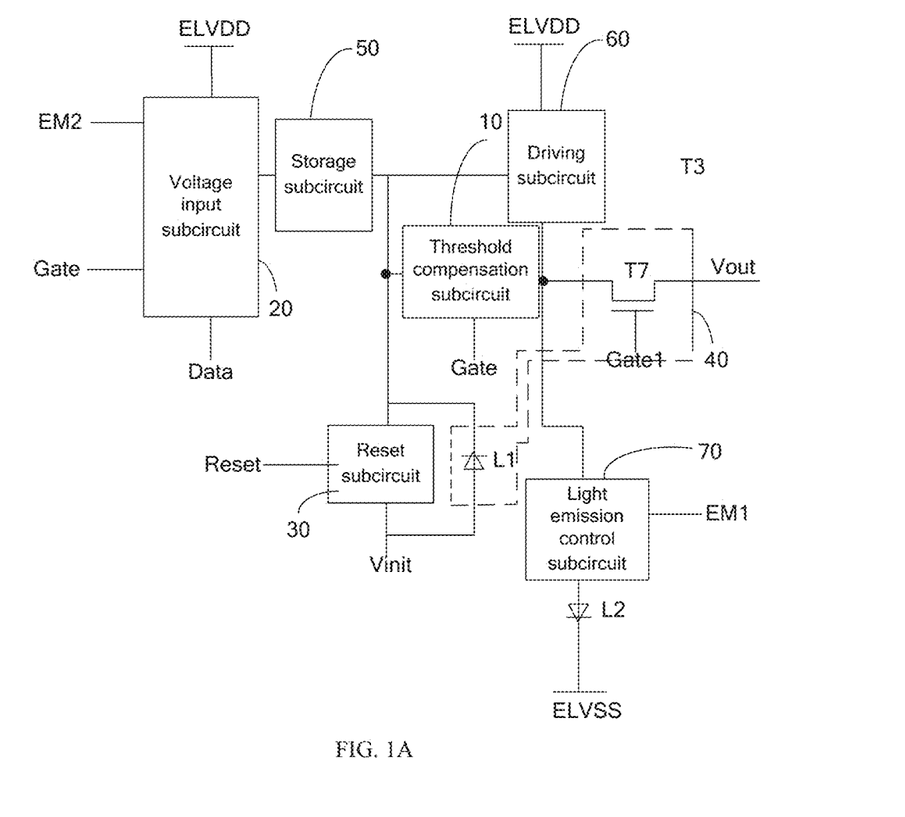
FIG. 1A is a schematic diagram of a pixel driving circuit according to an embodiment of the present disclosure.

The present disclosure provides a pixel driving circuit for driving the light emitting device L2 to emit light. As shown in FIG. 1A, the pixel driving circuit includes: a threshold compensation subcircuit 10, a reset subcircuit 30, a driving subcircuit 60, a light emission control subcircuit 70, an optical signal detection subcircuit 40, a storage subcircuit 50, and a voltage input subcircuit 20; the threshold compensation subcircuit 10 is electrically coupled to the driving subcircuit 60, the optical signal detection subcircuit 40, the storage subcircuit 50, the reset subcircuit 30 and a second gate line Gate, and is configured to perform threshold compensation on a driving transistor included in the driving subcircuit 60 according to a signal provided on the second gate line Gate; the reset subcircuit 30 is electrically coupled to the threshold compensation subcircuit 10, the optical signal detection subcircuit 40, a reset signal terminal Reset and an initial voltage terminal Vinit, and is configured to reset the driving subcircuit 60 under control of a reset signal provided by the reset signal terminal Reset; the driving subcircuit 60 is electrically coupled to the light emission control subcircuit 70, the driving power supply terminal ELVDD, the threshold compensation subcircuit 10 and the optical signal detection subcircuit 40, and is configured to drive the light emitting device L2 to emit light; the light emission control subcircuit 70 is electrically coupled to the driving subcircuit 60, the light emitting device L2 and a first light emission control terminal EM1, and is configured to control the light emitting device L2 to emit light under control of a first light emission control signal provided by the first light emission control terminal EM1; the storage subcircuit 50 is electrically coupled to the voltage input subcircuit 20, the driving subcircuit 60 and the threshold compensation circuit 10, and is configured to store a data voltage Vdata and a driving voltage Vdd; and the voltage input subcircuit 20 is electrically coupled to the storage subcircuit 50, a second light emission control terminal EM2, the second gate line Gate, the driving power supply terminal ELVDD, and a data line Data, and is configured to provide the data voltage Vdata and the driving voltage Vdd to the storage subcircuit 50 according to a signal on the second gate line Gate and a second light emission control signal on the second light emission control signal terminal EM2, wherein the optical signal detection subcircuit 40 is electrically coupled to both terminals of the reset subcircuit 30, and is configured to detect an optical signal which is incident on a region where the optical signal detection subcircuit 40 is located. In the present application, the light emitting device may be, for example, an OLED (Organic Light emitting Diode).

Working stages of the pixel driving circuit of the present disclosure include a display reset stage, a compensation stage and a light emission stage.

Figure 1B:
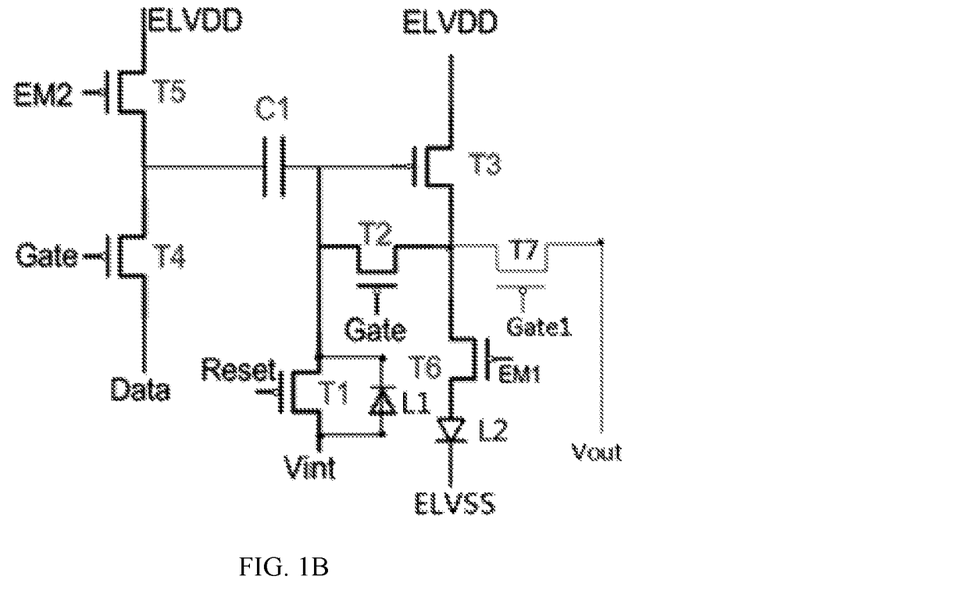
FIG. 1B is a schematic diagram of a pixel driving circuit according to an embodiment of the present disclosure.

As shown in FIG. 1B, the driving subcircuit 60 includes a driving transistor T3, the reset subcircuit 30 includes a first transistor T1. A control electrode of the driving transistor T3 is coupled to a second electrode of the first transistor, a first electrode of the driving transistor is coupled to the light emission control subcircuit, and a second electrode of the driving transistor is coupled to the driving power supply terminal ELVDD.

The threshold compensation subcircuit 10 is connected between a control electrode and a first electrode of the driving transistor T3, the first electrode of the driving transistor T3 is coupled to the light emitting device L2 via the light emission control subcircuit 70. The threshold compensation subcircuit 10 may cause a current flowing through the light emitting device L2 to be independent of a threshold voltage Vth of the driving transistor T3 during a light emitting stage of the light emitting device L2; the voltage input circuit 20 may be configured to maintain a voltage of the control electrode of the driving transistor during the light emitting stage of the light emitting device L2, so as to facilitate introducing a data voltage during the light emitting stage. The voltage input circuit 20 is controlled by a first gate line Gate and a second light emission control terminal EM2, and has a first terminal coupled to a data voltage terminal Data, a second terminal coupled to one terminal of the capacitor C1, and a third terminal coupled to a driving power supply terminal ELVDD. The reset subcircuit 30 is controlled by a reset signal terminal Reset, and has one terminal coupled to the control electrode of the driving transistor T3, and other terminal coupled to an initial voltage terminal Vinit, the reset subcircuit 30 is configured to reset a voltage of the control electrode of the driving transistor T3 in the display reset stage.

The optical signal detection subcircuit 40 is coupled to the threshold compensation subcircuit 10 and the reset subcircuit 30; the optical signal detection subcircuit 40 is configured to detect an optical signal which is incident on a region where the optical signal detection subcircuit 40 is located.

The pixel driving circuit of an embodiment of the present disclosure is provided with the optical signal detection subcircuit 40, and the optical signal detection subcircuit 40 may detect an optical signal which is incident on the position where the optical signal detection subcircuit 40 is located, so that an electronic apparatus using the pixel driving circuit does not need to be provided with an independent optical signal detection module, thereby simplifying a circuit structure inside the electronic apparatus.

In an embodiment, the optical signal detection subcircuit 40 may include: a photosensitive device L1 which is connected between the first electrode and the second electrode of any transistor in the pixel driving circuit, wherein the photosensitive device L1 is connected between the first electrode and the second electrode of any transistor in the pixel driving circuit. FIG. 1B is a circuit diagram illustrating a pixel driving circuit according to an embodiment of the present disclosure. As shown in FIG. 1B, the threshold compensation subcircuit 10 includes a second transistor T2; the voltage input circuit 20 includes a fourth transistor T4 and a fifth transistor T5; the reset subcircuit 30 includes a first transistor T1; the optical signal detection subcircuit 40 includes a photosensitive device L1 and a seventh transistor T7; the light emission control subcircuit 70 includes a sixth transistor T6; the storage subcircuit 50 includes a capacitor C1, wherein a detected optical signal is output from a signal read terminal Vout.

The photosensitive device L1 of the optical signal detection subcircuit 40 of the present disclosure may be coupled between both terminals of any one of the first transistor T1, the second transistor T2, the third transistor T3, the fourth transistor T4, the fifth transistor T5, the sixth transistor T6, and the seventh transistor T7 shown in FIG. 1B. However, the photosensitive device L1 may be coupled between both terminals of a transistor other than the transistors related to a light emission control of the light emitting device L2, in consideration of not adversely affecting the light emitting device L2 as much as possible, and here, also taking FIG. 1B as an example, in which the third transistor T3, the fourth transistor T4, the fifth transistor T5 and the sixth transistor T6 are transistors related to the light emission of the light emitting device. In order to prevent connection of the photosensitive device L1 from adversely affecting the light emission of the light emitting device, the photosensitive device L1 may be coupled between the first and second electrodes of any one of the transistors other than the third transistor T3, the fourth transistor T4, the fifth transistor T5 and the sixth transistor T6 in the pixel driving circuit shown in FIG. 1B. FIG. 1B shows only one case where the photosensitive device L1 is coupled between the first and second electrodes of the first transistor T1.

In an embodiment, the photosensitive device L1 may be a PIN type photosensitive device, i.e., a photodiode with a P-I-N structure. The PIN type photosensitive device may make the optical signal detection subcircuit have a better light absorption performance.

In an embodiment, the first transistor T1 is coupled to the initial voltage terminal Vint of the pixel driving circuit, and the optical signal detection subcircuit includes a photosensitive device L, wherein the photosensitive device L1 is connected between the first electrode and the second electrode of the first transistor T1. Still taking FIG. 1B as an example, the first transistor T1 is coupled to the initial voltage terminal Vint of the pixel driving circuit, and the photosensitive device L1, for example, the photodiode shown in FIG. 1B, is coupled between two terminals of the first transistor T1. In FIG. 1B, the photodiode is coupled between the first electrode and the second electrode of the first transistor T1. In this way, the photodiode is coupled between two terminals of the first transistor T1, such that traces and signal leads of the pixel driving circuit may be reduced, thereby simplifying the structure of the pixel driving circuit, while the photodiode and the initial voltage terminal Vint may share signals with each other.

In an embodiment, the pixel driving circuit may further include: the reset subcircuit 30 which includes a first transistor T1, the optical signal detection subcircuit includes a photosensitive device L, and the photosensitive device L1 is connected between the first electrode and the second electrode of the first transistor T1. Also taking the pixel driving circuit shown in FIG. 1B as an example, a control electrode of the first transistor T1 is coupled to a reset signal terminal Reset, and the reset subcircuit may be used to reset the control electrode of the driving transistor. In the pixel driving circuit shown in FIG. 1B, the driving transistor may be, for example, the third transistor T3. The photosensitive device L1 of the photodiode is connected between the first and second electrodes of the first transistor T1. In this way, the photosensitive device L1 of the photodiode is coupled between two terminals of the first transistor T1, such that traces and signal leads of the pixel driving circuit may be reduced, thereby simplifying the structure of the pixel driving circuit.

In an embodiment, the pixel driving circuit may further include a first switch element, the optical signal detection subcircuit may further include a second switch element, and a first electrode of the first switch element is coupled to the light emitting device; a second electrode of the first switch element is coupled to a first electrode of the second switch element; a second electrode of the second switch element is coupled to an output terminal of the optical signal detection subcircuit; a control electrode of the second switch element is coupled to a first gate line. Still taking the pixel driving circuit shown in FIG. 1B as an example, the first switch element is, for example, the sixth transistor T6 shown in FIG. 1B, and the second switch element is, for example, the seventh transistor T7 shown in FIG. 1B. As shown in FIG. 1B, the control electrode of the sixth transistor T6 is connected to a first light emission control terminal EM1, for controlling the light emitting device L2 to emit light based on a signal input from the first light emission control terminal EM1. An anode of the light emitting device L2 is coupled to the first electrode of the sixth transistor T6, and a cathode of the light emitting device L2 is coupled to a first power line terminal ELVSS. The control electrode of the seventh transistor T7 is coupled to the first gate line Gate1, for controlling whether to output an optical signal detected by the optical signal detection subcircuit according to a signal on the first gate line Gate 1.

In an exemplary embodiment, the pixel driving circuit further includes a storage subcircuit 50 for storing voltages provided from a driving power supply terminal and a data voltage terminal of the pixel driving circuit; a reset subcircuit 30 for resetting a control electrode of the driving transistor; and a third switch element having a first electrode coupled to the reset subcircuit and the storage subcircuit 50, a second electrode coupled to a first electrode of the driving transistor and the second electrode of the first switch element; and a second electrode of the driving transistor is coupled to the driving power supply terminal ELVDD; and a photosensitive device is connected between the first electrode and the second electrode of the third switch element.

Figure 1C:
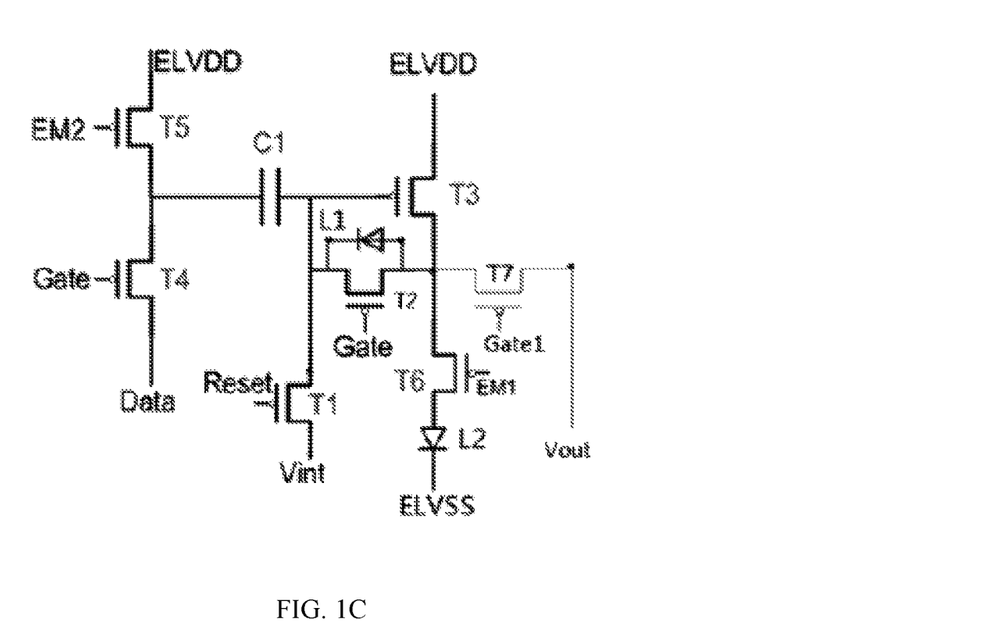
FIG. 1C is a schematic diagram of a pixel driving circuit according to an embodiment of the present disclosure.

Taking the pixel driving circuit shown in FIG. 1C as an example, the storage subcircuit 50 is, for example, the capacitor C1 shown in FIG. 1C; the third switch element is, for example, the second transistor T2 shown in FIG. 1C, the control electrode of the second transistor T2 is coupled to the second gate line Gate, for controlling whether to enable an introduction of a compensation voltage of the driving power supply terminal ELVDD according to a signal input through the second gate line Gate; and the driving transistor is, for example, the third transistor T3 shown in FIG. 1C. In this embodiment, the photosensitive device is not connected between the first electrode and the second electrode of the first transistor T1, as shown in FIG. B, but is connected between the first electrode and the second electrode of the second transistor T2, as shown in FIG. 1C. The photosensitive device L1 is coupled between both terminals of the second transistor T2, such that the photosensitive device L1 may not affect the light emission of the light emitting device.

In an embodiment, the second transistor T2 and the first transistor T1 may be thin film transistors made of indium gallium zinc oxide (IGZO TFTs), so that the pixel driving circuit according to the embodiment of the present disclosure may maintain signals better. Therefore, the pixel driving circuit of the embodiment of the present disclosure may ensure that a signal is not leaked out as much as possible.

In an embodiment, the voltage input circuit 20 may include: a fourth switch element and a fifth switch element, the fourth switch element has a control electrode coupled to the second gate line Gate, a first electrode coupled to the data voltage terminal Data, a second electrode coupled to the storage subcircuit 50 and a first electrode of the fifth switch element; the fifth switch element has a control electrode coupled to the second light emission control terminal EM2, a second electrode coupled to the driving power supply terminal ELVDD. Also taking the pixel driving circuit shown in FIG. 1B as an example, the fourth switch element is, for example, the fourth transistor T4 shown in FIG. 1B, and the fifth switch element is, for example, the fifth transistor T5 shown in FIG. 1B. The fourth transistor T4 is controlled whether to write the data voltage to the capacitor C1 (which is one example of the storage subcircuit 50) according to a signal input through the second gate line Gate, and the fifth transistor T5 is used to control whether to write the driving voltage to the capacitor C1 according to a signal input through the second light emission control terminal EM2. In another implementation, the fourth switch element and the fifth switch element (e.g., the fourth transistor T4 and the fifth transistor T5 shown in FIGS. 1B and 1C, respectively) may be IGZO TFTs. Therefore, the pixel driving circuit of the embodiment of the present disclosure may ensure that a signal is not leaked out as much as possible.

Figure 2:
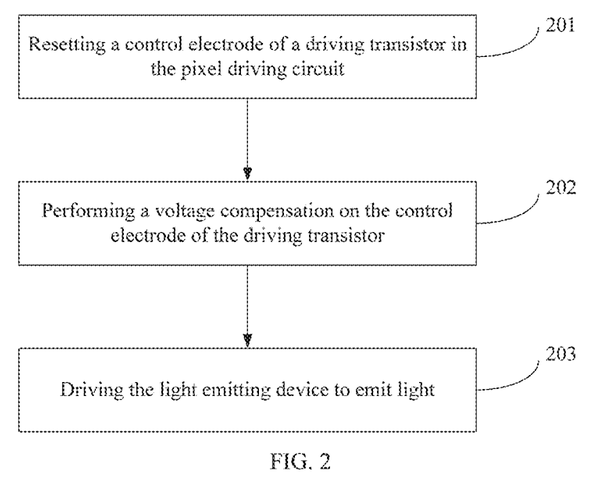
FIG. 2 is a flowchart illustrating a driving method for a pixel driving circuit according to an embodiment of the present disclosure.

An embodiment of the present disclosure further provides a driving method for a pixel driving circuit, which is used for driving any one of the above pixel circuits. FIG. 2 is a flowchart of a driving method for a pixel driving circuit according to the embodiment of the present disclosure. As shown in FIG. 2, the method includes:

Step 201: resetting a control electrode of a driving transistor in the pixel driving circuit;

Taking the pixel driving circuit shown in FIG. 1B as an example, a reset signal is input to the reset signal terminal Reset, thereby resetting the control electrode of the driving transistor (the third transistor T3 shown in FIGS. 1B and 1C).

Step 202: performing a voltage compensation on the control electrode of the driving transistor;

In step 202, a signal is input to the second light emission control terminal EM2 to turn on the fifth transistor T5, so that a driving voltage (an ELVDD voltage, Vdd) of the driving power supply terminal is introduced to the left terminal of the capacitor C1, so that the ELVDD voltage is introduced to a gate of the driving transistor (the third transistor T3) serving as a source follower, which facilitates the voltage input to the light emitting device L2 in the subsequent light emission stage.

Step 203: driving the light emitting device to emit light.

In step 202, the driving transistor (the third transistor T3) has been turned on, and in step 203, a signal is input to the first light emission control terminal EM1 so that the sixth transistor T6 is turned on, and the light emitting device L2 emits light.

While driving the light emitting device in the pixel driving circuit to emit light, the driving method for the pixel driving circuit according to the embodiment of the present disclosure may enable the optical signal detection subcircuit in the pixel driving circuit to receive signals synchronously. For example, different voltages are caused at the two terminals of the photosensitive device L1 due to different valleys and ridges of the fingerprint in the course of the fingerprint detection, such that a light emitting brightness of the light emitting device may be different, and further an output value of the output terminal Vout detected by the optical signal detection subcircuit 40 may be different, so that the pixel driving circuit may achieve the purpose of detecting optical signals.

In an embodiment, the pixel driving circuit may further include a first switch element (e.g., the sixth transistor T6 in FIGS. 1A and 1B), the optical signal detection subcircuit may further include a second switch element (e.g., the seventh transistor T7 in FIGS. 1A and 1B), a first electrode of the first switch element is coupled to the light emitting device, a second electrode of the first switch element is coupled to a first electrode of the second switch element, a second electrode of the second switch element is coupled to an output terminal Vout of the optical signal detection subcircuit, and a control electrode of the second switch element is coupled to the first gate line Gate 1; the method further includes controlling the second switch element to be turned on during the light emission stage of the light emitting device.

Figure 3:
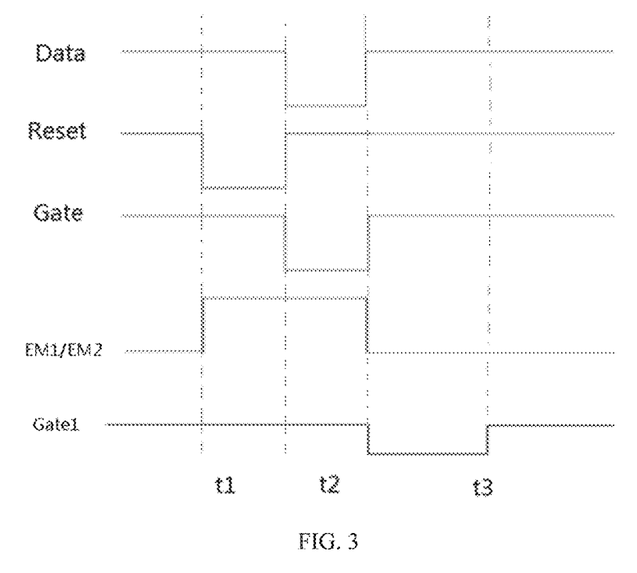
FIG. 3 is a timing diagram illustrating signals input to respective terminals of a pixel driving circuit according to an embodiment of the present disclosure when the circuit is in operation.

FIG. 3 is a timing diagram illustrating signals input to respective terminals of a pixel driving circuit according to an exemplary embodiment of the present disclosure when the circuit is in operation, which may include three stages, respectively shown in FIG. 3 as the display reset stage t1, the compensation stage t2 and the light emission stage t3, and in respective stages, current flows of the pixel driving circuit are as shown in FIG. 4 to FIG. 8.

Figure 4:
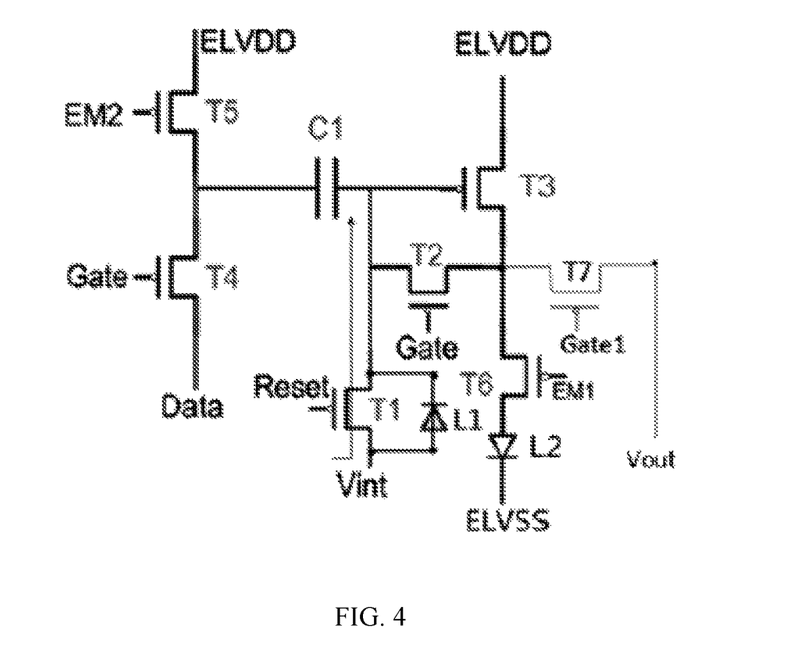
FIG. 4 is a schematic diagram illustrating current flow in a pixel driving circuit according to an embodiment of the present disclosure.

In the display reset stage t1, as shown in FIG. 3, the data voltage terminal Data, the second gate line Gate, the first gate line Gate1, and the first light emission control terminal EM1 and the second light emission control terminal EM2 is at a high level, the reset signal terminal Reset is at a low level, a signal on the reset signal terminal Reset is valid, and the current flow of the pixel driving circuit is in a direction indicated by an arrow in FIG. 4, thereby resetting a gate of the driving transistor.

Figure 5:
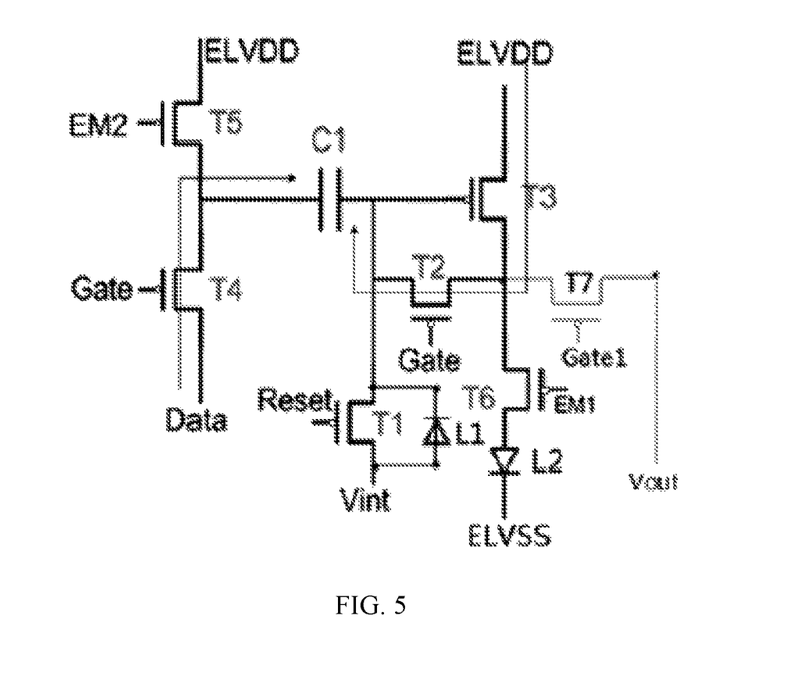
FIG. 5 is a schematic diagram illustrating current flow in a pixel driving circuit according to an embodiment of the present disclosure.

In the compensation stage t2, as shown in FIG. 3, the reset signal terminal Reset, the first light emission control terminal EM1 and the second light emission control terminal EM2, and the first gate line Gate1 are at a high level, the data voltage terminal Data and the second gate line Gate are at a low level, signals of the data voltage terminal Data and the second gate line Gate terminal are valid to apply a voltage across the capacitor C1, and the current flow of the pixel driving circuit is in a direction shown by an arrow in FIG. 5: a data voltage (Vdate) is applied to the left terminal of the capacitor C1 such that the voltage on the control electrode of the source follower (the third transistor T3 in FIG. 5) becomes Vdd−Vth (Vdd is the ELVDD voltage, and Vth is a threshold voltage of the third transistor T3), which facilitates the voltage input to the light emitting device L2 in the subsequent light emission stage, and the current flow of the pixel driving circuit is in a direction shown by an arrow in FIG. 5.

Figure 6:
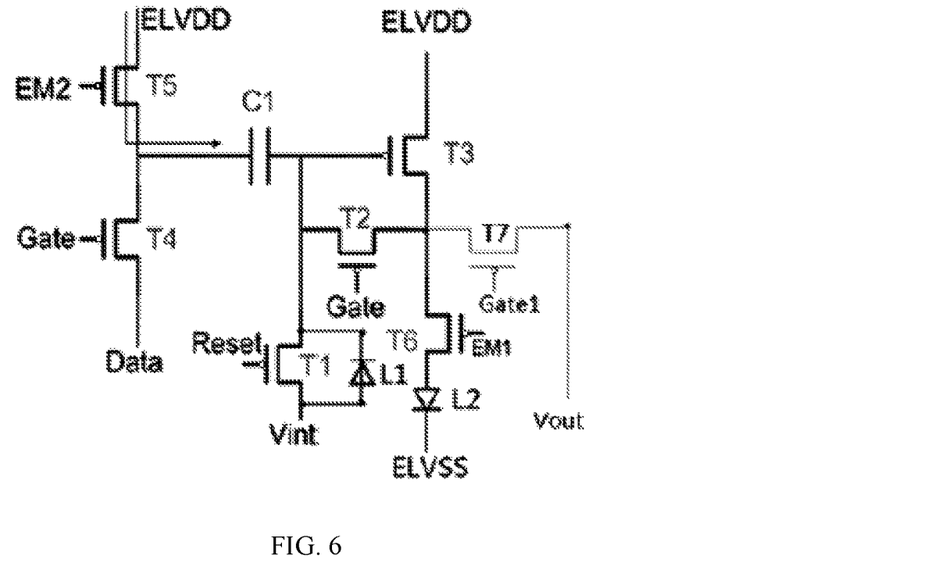
FIG. 6 is a schematic diagram illustrating current flow in a pixel driving circuit according to an embodiment of the present disclosure.
Figure 7:
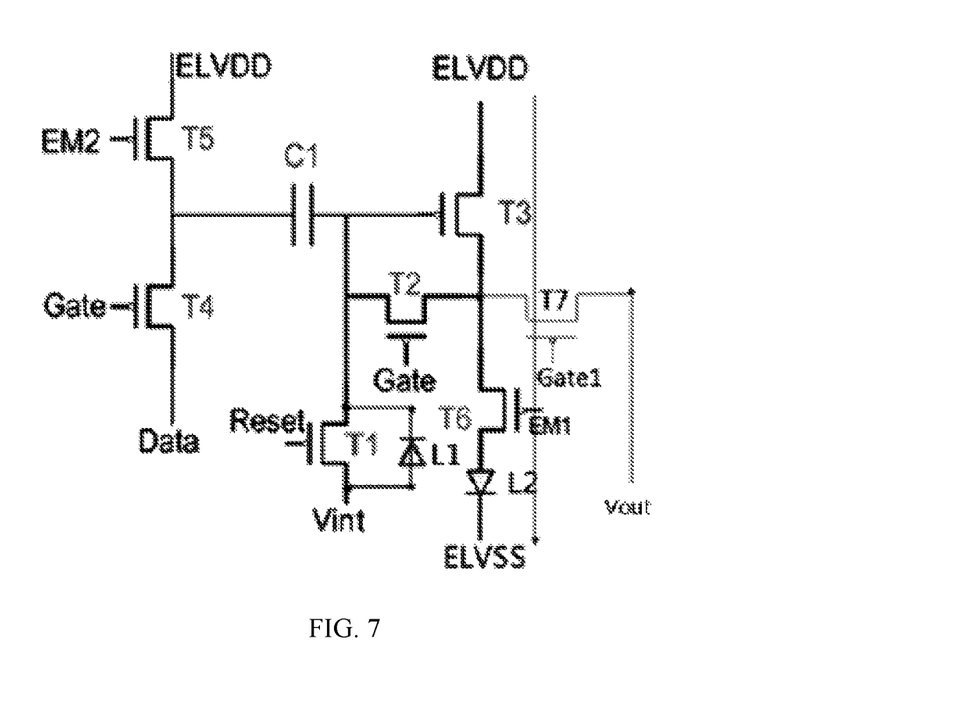
FIG. 7 is a schematic diagram illustrating current flow in a pixel driving circuit according to an embodiment of the present disclosure.
Figure 8:
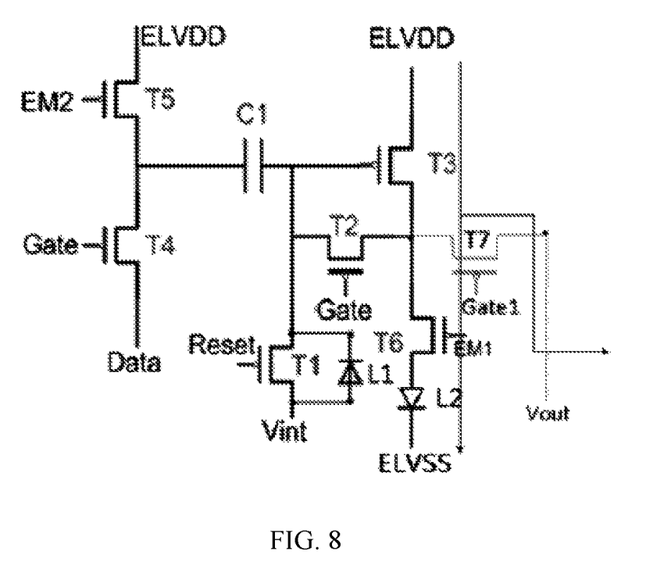
FIG. 8 is a schematic diagram illustrating current flow in a pixel driving circuit according to an embodiment of the present disclosure.

In the light emission stage t3, as shown in FIG. 3, the data voltage terminal Data, the reset signal terminal Reset, and the second gate line Gate are all at a high level, the first light emission control terminal EM1 and the second light emission control terminal EM2, and the first gate line Gate1 are at a low level, signals of the first light emission control terminal EM1 and the second light emission control terminal EM2 and the first gate line Gate1 are valid. At this time, the fifth transistor T5 is turned on, one terminal of the capacitor C1 coupled to the fifth transistor T5 is supplied with the driving voltage Vdd, due to bootstrap characteristics of the capacitor C1, a voltage on one terminal of the capacitor C1 coupled to the third transistor 13 becomes 2Vdd−Vdata−Vth. As shown in FIG. 6, in this stage, the reset voltage Vint is less than 2Vdd−Vdata−Vth, the photosensitive device L1 is in a reverse bias state. After a period of illumination, a voltage on the gate of the source follower (the third transistor T3 in FIG. 7) is reduced to 2Vdd−Vdata−Vth−AV due to the PIN photodiode (as one example of the above photosensitive device L1) being illuminated. In this stage, the first gate line Gate1 receives a valid signal and the seventh transistor T7 is turned on, so that it may be realized that the photosensitive device L1 may receive an optical signal simultaneously while the light emitting device L2 emits light, wherein the current flow in the pixel driving circuit is as indicated by an arrow in FIG. 7.

In the light emission stage, the current flowing through the light emitting device L2 is:

$$I_{OLED}=K(Vgs+Vth)^2=K(2Vdd-Vdata-Vth-Vdd+Vth)^2=K(Vdd-Vdata)^2$$

where K is characteristics related to the driving transistor T3.

In this stage, the reset voltage Vint is less than 2Vdd−Vdata−Vth, so that the PIN photodiode is reversely biased (the light emitting device emits light at this time). Different voltages ΔV are caused at the two terminals of the photosensitive device L1 due to different valleys and ridges of the fingerprint in fingerprint detection, such that the light emitting device may emit different light, and further an output value detected by the optical signal detection subcircuit may be different in magnitude, wherein the current flow in the pixel driving circuit is as indicated by an arrow in FIG. 8

As shown in FIG. 3, in the light emission stage t3, after the fingerprint recognition is finished, the first gate line Gate1 may be set to a high level, and at this time, the seventh transistor T7 is turned off, and the voltage will not be output through the output terminal Vout.

Figure 10:
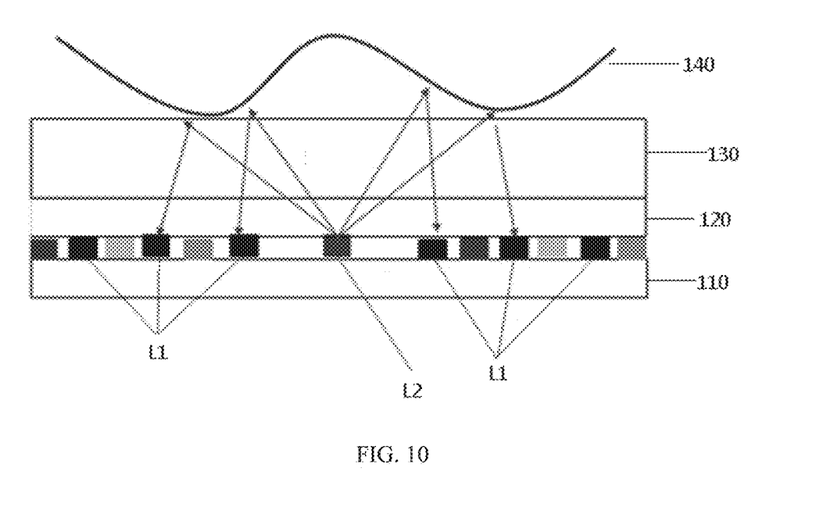
FIG. 10 is a cross-sectional view of a part of a display panel according to an embodiment of the present disclosure.

An embodiment of the present disclosure also provides a display panel. As shown in FIG. 10, the display panel includes: a substrate 110, a light emitting device L2 and a photosensitive device L1 which are integrally arranged on the substrate, a polarizer 120 and a glass cover plate 130. In the display panel of the present disclosure, a photosensitive device L1 is provided between the polarizer 120 and the substrate 110 of the display panel, and is used for detecting an optical signal which is incident on a region (for example, a texture of the finger 140) where the photosensitive device L1 is located.

Figure 9:
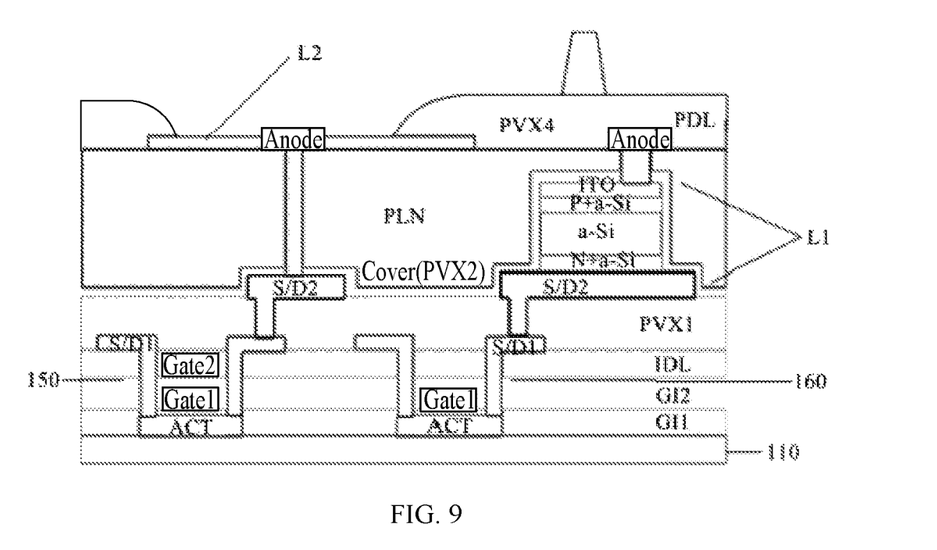
FIG. 9 is a cross-sectional view of a part of a display panel according to an embodiment of the present disclosure.

FIG. 9 is a cross-sectional view of a portion of the display panel according to an exemplary embodiment of the present disclosure. As shown in FIG. 9, a first transistor 150, a second transistor 160, a light emitting device L2 (only an anode is shown) and a photosensitive device L1 for detecting an optical signal are formed on a substrate 110 of the display panel, and the first transistor 150 includes an active layer ACT, a first gate Gate1, a second gate Gate2, a first source/drain layer S/D1; the second transistor 160 includes an active layer ACT, a first gate Gate1, a first source/drain layer S/D1; a first gate insulating layer GI1 is formed between active layers ACT of the first transistor 150 and the second transistor 160; a second gate insulating layer GI2 is formed between first gates Gate1 of the first transistor 150 and the second transistor 160; an insulating layer ILD is formed on the second gate insulating layer GI2; a passivation layer PVX1 is formed on the insulating layer ILD; a second source/drain layer S/D2, and an anode layer Anode is formed on the passivation layer PVX1. For the photosensitive device L1, the second source/drain layer S/D2 is used as its cathode, the anode layer Anode is used as its anode, the anode of the photosensitive device L1 and the anode of the light emitting device L2 are in the same layer, and a pixel definition layer PDL is formed on the anode of the photosensitive device L1 for defining the light emitting device L2. The first transistor 150 is used to control light emission of the light emitting device L2, and the second transistor 160 is used to control the photosensitive device L1. A planarization layer PLN is also provided between the second source/drain layer S/D2 and the anode layer Anode. An N-type amorphous silicon layer, an amorphous silicon layer, a P-type amorphous silicon, and an ITO electrode layer of the photosensitive device are sequentially provided on the planarization layer PLN in a direction distal to the substrate 110.

In an embodiment, the optical signal detection subcircuit in the display panel may be used for fingerprint recognition, so that the optical signal detection subcircuit may be integrated in the display panel, and the pixel driving circuit shown in FIG. 1B is also taken as an example, whether a fingerprint recognition signal is output may be controlled by the seventh transistor T7. It should be noted that if only the display stage of the light emitting device is performed, fingerprint recognition is not involved; the photosensitive device needs to be kept in a reverse bias state all the time in the light emission stage of the light emitting device, so that the control electrode of the source follower may be supplemented for an electric leakage caused by a parasitic capacitance at any time, and thus, an image retention may be ensured.

It should be noted that, in the display panel according to the embodiment of the present disclosure, after the light emitted by the light emitting device in a pixel is reflected, the corresponding photosensitive device is not usually in a same pixel. As shown in FIG. 10, for example, light from a point light source in a pixel is reflected by a fingerprint and then irradiated on corresponding photosensitive devices in several peripheral pixels, so that the point light source and the corresponding photosensitive device for detecting an optical signal are not usually in a same pixel.

An embodiment of the present disclosure further provides a display apparatus, which may include any one of the above pixel driving circuits or any one of the above display panels.

It should be noted that each transistor in the above embodiments may be a thin film transistor made of a material selected from one of polysilicon, amorphous silicon, oxide or an organic thin film transistor. The "control electrode" referred to in this embodiment may specifically refer to a gate of a transistor or a base of a triode, the "first electrode" may specifically refer to a source of the transistor or an emitter of the triode, and the corresponding "second electrode" may specifically refer to a drain of the transistor or a collector of the triode. Of course, it should be understood by one of ordinary skill in the art that the "first electrode" and "second electrode" are interchangeable.

In addition, the transistors in above embodiments may all be P-type transistors, which is a preferable solution that is convenient to implement in this embodiment, and does not limit the technical solution of the present disclosure. It should be understood by one of ordinary skill in the art that the type (N-type or P-type) of each transistor may be changed, and positive and negative polarities of the output voltages of each power source terminal and the control signal line may be changed to achieve the same solution as in the present embodiment in which as a same turn-on or turn-off operation is performed for each transistor, which all fall within the protection scope of the present disclosure. This is not specifically illustrated here.

In an embodiment of the present disclosure, for an N-type transistor, a first electrode is a source and a second electrode is a drain, and for a P-type transistor, a first electrode is a drain and a second electrode is a source.

One of ordinary skill in the art will understand that: a discussion for any embodiment above is only exemplary, and is not intended to imply that a scope of the present disclosure, including claims, is limited to these examples; with an idea of the present disclosure, technical features between the above embodiments or different embodiments may be also combined, steps may be implemented in any order, and there are many other variations of different aspects of the present disclosure as described above, which are not provided in detail for the sake of brevity.

In addition, well known power/ground connections to Integrated Circuit (IC) chips and other components may not be shown in the drawings for simplicity of illustration and discussion so as not to obscure the present disclosure. Further, in order to avoid obscuring the present disclosure, an apparatus may be shown in a form of block diagrams, in view of a fact: details on implementations of such an apparatus shown in a form of block diagrams are dependent upon a platform within which the present disclosure is to be implemented (i.e., details should fall within a scope for which one of ordinary skill in the art could understand). In a case where specific details (e.g., circuits) are set forth in order to describe example embodiments of the present disclosure, it should be apparent to one of ordinary skill in the art that the present disclosure may be implemented without, or with variation of, these specific details. Accordingly, the description is to be regarded as illustrative instead of restrictive.

While the present disclosure has been described in conjunction with specific embodiments thereof, many alternatives, modifications, and variations of these embodiments will be apparent to one of ordinary skill in the art in light of the foregoing description. For example, other memory architectures (e.g., dynamic RAM (DRAM)) may use the embodiments discussed.

Embodiments of the present disclosure are intended to embrace all such alterations, modifications and variations that fall within a broad scope of appended claims. Therefore, any omissions, modifications, equivalent alterations, improvements, and the like that may be made without departing from a spirit or a principle of the present disclosure are intended to be included within a scope of the present disclosure.

What is claimed is:

1. A pixel driving circuit for driving a light emitting device to emit light, comprising: a threshold compensation subcircuit, a reset subcircuit, a driving subcircuit, a light emission control subcircuit, an optical signal detection subcircuit, a storage subcircuit, and a voltage input subcircuit; wherein the threshold compensation subcircuit is electrically coupled to the driving subcircuit, the optical signal detection subcircuit, the storage subcircuit, the reset subcircuit and a second gate line, and is configured to perform threshold compensation on a driving transistor included in the driving subcircuit according to a signal on the second gate line;

the reset subcircuit is electrically coupled to the threshold compensation subcircuit, the optical signal detection subcircuit, a reset signal terminal and an initial voltage terminal, and is configured to reset the driving subcircuit under control of a reset signal provided by the reset signal terminal;

the driving subcircuit is electrically coupled to the light emission control subcircuit, a driving power supply terminal, the threshold compensation subcircuit and the optical signal detection subcircuit, and is configured to drive the light emitting device to emit light;

the light emission control subcircuit is electrically coupled to the driving subcircuit, the light emitting device and a first light emission control terminal, and is configured to control the light emitting device to emit light under control of a first light emission control signal provided by the first light emission control terminal;

the storage subcircuit is electrically coupled to the voltage input subcircuit, the driving subcircuit and the threshold compensation circuit, and is configured to store a data voltage and a driving voltage therein; and the voltage input subcircuit is electrically coupled to the storage subcircuit, a second light emission control terminal, the second gate line, the driving power supply terminal, and a data line, and is configured to provide the data voltage and the driving voltage to the storage subcircuit according to a signal on the second gate line and a second light emission control signal, wherein the optical signal detection subcircuit is electrically coupled between both terminals of the reset subcircuit, and is configured to detect an optical signal which is incident on a region where the optical signal detection subcircuit is located; and wherein the light emission control subcircuit comprises: a sixth transistor having a control electrode coupled to a first light emission control terminal, a first electrode coupled to a first electrode of the light emitting device, and a second electrode coupled to a first electrode of the driving transistor;

the optical signal detection subcircuit further comprises a seventh transistor having a control electrode coupled to a first gate line, a first electrode coupled to the first electrode of the driving transistor, and a second electrode coupled to an output terminal of the optical signal detection subcircuit; and the pixel driving circuit further comprises a reference power supply terminal coupled to a second electrode of the light emitting device.

2. The pixel driving circuit according to claim 1, wherein the optical signal detection subcircuit comprises a photosensitive device.

3. The pixel driving circuit according to claim 2, wherein the reset subcircuit comprises a first transistor, which has a control electrode coupled to the reset signal terminal, a first electrode coupled to the initial signal terminal, and a second electrode coupled to the driving subcircuit, and
a first electrode and a second electrode of the photosensitive device are coupled to the first electrode and the second electrode of the first transistor, respectively.

4. The pixel driving circuit according to claim 3, wherein the driving subcircuit comprises a driving transistor, which has a control electrode coupled to a second electrode of the first transistor, the first electrode coupled to the light emission control subcircuit and a second electrode coupled to the driving power supply terminal.

5. The pixel driving circuit according to claim 4, wherein the threshold compensation subcircuit comprises a second transistor, which has a control electrode coupled to the second gate line, a first electrode coupled to the control electrode of the driving transistor, and a second electrode coupled to the first electrode of the driving transistor.

6. The pixel driving circuit according to claim 1, wherein the storage subcircuit comprises a capacitor having a first terminal coupled to the control electrode of the driving transistor, the first electrode of the second transistor and the second electrode of the first transistor, and a second terminal coupled to the voltage input subcircuit.

7. The pixel driving circuit according to claim 6, wherein the voltage input subcircuit comprises:
a fourth transistor having a control electrode coupled to the second gate line, a first electrode coupled to the data voltage terminal, and a second electrode coupled to the second terminal of the storage subcircuit; and
a fifth transistor having a control electrode coupled to the second light emission control terminal, a first electrode coupled to the second terminal of the capacitor, and a second electrode coupled to the driving power supply terminal.

8. The pixel driving circuit according to claim 7, wherein the first transistor, the second transistor, the fourth transistor and the fifth transistor are both thin film transistors made of indium gallium zinc oxide.

9. A method for driving the pixel driving circuit according to claim 8, comprising a display reset stage, a compensation stage and a light emission stage,
in the display reset stage, a signal on a reset signal terminal is enabled to be valid, thereby resetting the control electrode of the driving transistor in the pixel driving circuit;
in the compensation stage, a signal on the second gate line is enabled to be valid, the data voltage is applied to the second terminal of the capacitor, and the second transistor is turned on, such that a voltage on the first terminal of the capacitor is Vdd-Vth and a voltage on the second terminal of the capacitor is Vdata, where Vdd is a driving voltage on the driving power supply terminal, Vth is a threshold voltage of the driving transistor, and Vdata is the data voltage;
in the light emission stage, a signal on the second light emission control terminal is enabled to be valid, and the fifth transistor is turned on, such that a voltage of the second terminal of the capacitor is Vdd, a voltage of the first terminal of the capacitor is 2Vdd-Vdata-Vth, thereby driving the light emitting device to emit light.

10. The method according to claim 9, wherein, in the light emission stage, a signal on the first gate line is enabled to be valid, and the seventh transistor is turned on, such that a voltage change due to the photosensitive device being illuminated is output from the output terminal.

11. The method according to claim 10, further comprising, after a period of time has elapsed in the light emission stage, disabling a signal on the first gate line and turning off the seventh transistor, such that the optical signal is no longer detected.

12. A display panel, comprising:
a substrate; and
a plurality of light emitting devices and a plurality of pixel driving circuits for respectively driving the plurality of light emitting devices on the substrate;
wherein at least one of the plurality of pixel driving circuits comprises: a threshold compensation subcircuit, a reset subcircuit, a driving subcircuit, a light emission control subcircuit, an optical signal detection subcircuit, a storage subcircuit, and a voltage input subcircuit; wherein
the threshold compensation subcircuit is electrically coupled to the driving subcircuit, the optical signal detection subcircuit, the storage subcircuit, the reset subcircuit and a second gate line, and is configured to perform threshold compensation on a driving transistor included in the driving subcircuit according to a signal on the second gate line;
the reset subcircuit is electrically coupled to the threshold compensation subcircuit, the optical signal detection subcircuit, a reset signal terminal and an initial voltage terminal, and is configured to reset the driving subcircuit under control of a reset signal provided by the reset signal terminal;
the driving subcircuit is electrically coupled to the light emission control subcircuit, a driving power supply terminal, the threshold compensation subcircuit and the optical signal detection subcircuit, and is configured to drive the light emitting device to emit light;
the light emission control subcircuit is electrically coupled to the driving subcircuit, the light emitting device and a first light emission control terminal, and is configured to control the light emitting device to emit light under control of a first light emission control signal provided by the first light emission control terminal;
the storage subcircuit is electrically coupled to the voltage input subcircuit, the driving subcircuit and the threshold compensation circuit, and is configured to store a data voltage and a driving voltage therein; and
the voltage input subcircuit is electrically coupled to the storage subcircuit, a second light emission control terminal, the second gate line, the driving power supply terminal, and a data line, and is configured to provide the data voltage and the driving voltage to the storage subcircuit according to a signal on the second gate line and a second light emission control signal,
wherein the optical signal detection subcircuit is electrically coupled between both terminals of the reset subcircuit, and is configured to detect an optical signal which is incident on a region where the optical signal detection subcircuit is located; and
wherein the light emission control subcircuit comprises: a sixth transistor having a control electrode coupled to a first light emission control terminal, a first electrode coupled to a first electrode of the light emitting device, and a second electrode coupled to a first electrode of the driving transistor;

the optical signal detection subcircuit further comprises a seventh transistor having a control electrode coupled to a first gate line, a first electrode coupled to the first electrode of the driving transistor, and a second electrode coupled to an output terminal of the optical signal detection subcircuit; and the pixel driving circuit further comprises a reference power supply terminal coupled to a second electrode of the light emitting device.

13. The display panel according to claim 12, further comprising:

a polarizer on the substrate; and a glass cover plate on the polarizer, wherein the light emitting device and the photosensitive device of the at least one of the plurality of the pixel driving circuits are between the substrate and the polarizer.

14. The display panel according to claim 13, further comprising a first transistor and a second transistor on the substrate, wherein the light emitting device and the photosensitive device are on the first transistor and the second transistor, respectively;

a first electrode of the light emitting device is electrically coupled to a first drain of the first transistor;

a second drain of the second transistor is electrically coupled to a second electrode of the photosensitive device;

the first electrode of the light emitting device and a first electrode of the photosensitive device are in a same layer; and a pixel definition layer for the light emitting device is on the first electrode of the photosensitive device.

15. The display panel according to claim 14, wherein the first transistor comprises a first active layer, a first gate, a second gate, a first source and a first drain on the substrate in sequence; the second transistor comprises a second active layer, a third gate, a second source and a second drain on the substrate in sequence; wherein the first active layer and the second active layer are in a same layer on the substrate; the first gate and the third gate are in a same layer; the first source, the first drain, the second source and the second drain are in a same layer;

the display panel further comprises a first passivation layer on the first source, the first drain, the second source and the second drain, and a second source/drain layer and a fourth source/drain layer in a same layer on the first passivation layer, wherein the second source/drain layer is electrically coupled to the first drain through a first via hole in the first passivation layer, and the fourth source/drain layer is electrically coupled to the second drain through a second via hole in the first passivation layer; and the display panel further comprises a second passivation layer on the second source/drain layer, a planarization layer on the second passivation layer, and a first electrode of the light emitting device on the planarization layer, wherein the first electrode of the light emitting device is coupled to the second source/drain layer through a third via hole in the second passivation layer and the planarization layer;

the display panel further comprises an N-type amorphous silicon layer, an amorphous silicon layer, a P-type amorphous silicon, an ITO electrode, the second passivation layer and the planarization layer on the second passivation layer on the fourth source/drain layer, wherein the first electrode of the photosensitive device is electrically coupled to the ITO electrode through a via hole in the second passivation layer and the planarization layer.

16. The display panel according to claim 15, wherein the optical signal detection subcircuit comprises a photosensitive device.

17. The display panel according to claim 16, wherein the reset subcircuit comprises a first transistor, which has a control electrode coupled to the reset signal terminal, a first electrode coupled to the initial signal terminal, and a second electrode coupled to the driving subcircuit, and a first electrode and a second electrode of the photosensitive device are coupled to the first electrode and the second electrode of the first transistor, respectively.

18. A display apparatus comprising the display panel of claim 12.

19. The display apparatus according to claim 18, wherein the optical signal detection subcircuit comprises a photosensitive device, the reset subcircuit comprises a first transistor, which has a control electrode coupled to the reset signal terminal, a first electrode coupled to the initial signal terminal, and a second electrode coupled to the driving subcircuit; and a first electrode and a second electrode of the photosensitive device are coupled to the first electrode and the second electrode of the first transistor, respectively.

* * * * *